(12) United States Patent
Mattela et al.

(10) Patent No.: US 11,101,800 B1
(45) Date of Patent: Aug. 24, 2021

(54) INTERLAYER EXCHANGE COUPLING LOGIC CELLS

(71) Applicant: Redpine Signals, Inc., San Jose, CA (US)

(72) Inventors: Venkat Mattela, San Jose, CA (US); Sanghamitra Debroy, Hyderabad (IN); Santhosh Sivasubramani, Madurai (IN); Amit Acharyya, Hyderabad (IN)

(73) Assignee: Redpine Signals, Inc., San Jose, CA (US)

( * ) Notice: Subject to any disclaimer, the term of this patent is extended or adjusted under 35 U.S.C. 154(b) by 0 days.

(21) Appl. No.: 17/006,819

(22) Filed: Aug. 29, 2020

(51) Int. Cl.
*H03K 19/0175* (2006.01)

(52) U.S. Cl.
CPC .......................... *H03K 19/017545* (2013.01)

(58) Field of Classification Search
CPC ............................................ H03K 19/017545
USPC ....................................................... 326/104
See application file for complete search history.

(56) References Cited

U.S. PATENT DOCUMENTS

| | | | | |
|---|---|---|---|---|
| 7,086,141 | B2 * | 8/2006 | Tsuchiya | B82Y 10/00 216/22 |
| 2004/0145850 | A1 * | 7/2004 | Fukumoto | H01F 41/302 361/143 |
| 2010/0266755 | A1 * | 10/2010 | Girt | G11B 5/65 427/131 |
| 2013/0049909 | A1 * | 2/2013 | Sweeney | H01F 1/0577 335/302 |
| 2018/0322994 | A1 * | 11/2018 | Rahman | H01L 27/222 |
| 2019/0013353 | A1 * | 1/2019 | Lee | H01L 27/228 |
| 2019/0295617 | A1 * | 9/2019 | Wang | G11C 11/1675 |

* cited by examiner

*Primary Examiner* — Don P Le
(74) *Attorney, Agent, or Firm* — File-EE-Patents.com; Jay A. Chesavage

(57) ABSTRACT

An NAND or NOR logic device has multiple layers of ferromagnetic material separated from each other by non-magnetic layers of electrically conductive material of atomic thickness, sufficient to generate anti-magnetic response in a magnetized layer. The anti-magnetic response in a layer below a layer magnetized with a polarity is summed in a region which is coupled to an output, the output generating at least one of a NAND, or NOR logic function on applied input magnetization.

18 Claims, 17 Drawing Sheets

Ferromagnetic coupling (J>0)

Anti-ferromagnetic coupling (J<0)

Interlayer Exchange Coupling (IEC) with lateral coupling

Section B-B

Section A-A

Figure 3
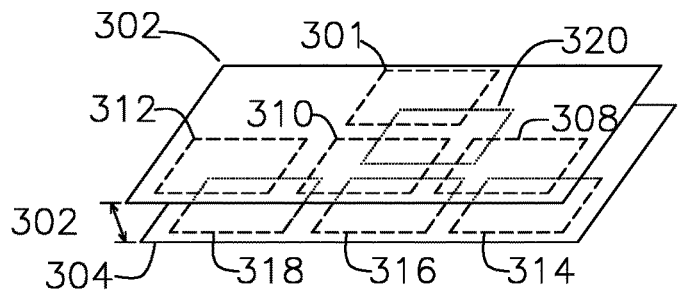
Figure 3A
Interlayer Exchange Coupling (IEC) with lateral coupling
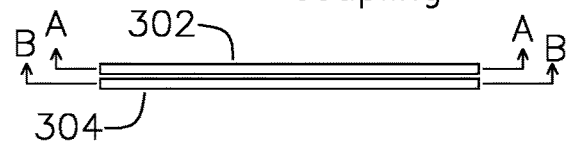
Figure 3B
Section A–A
Figure 3C
Section B–B
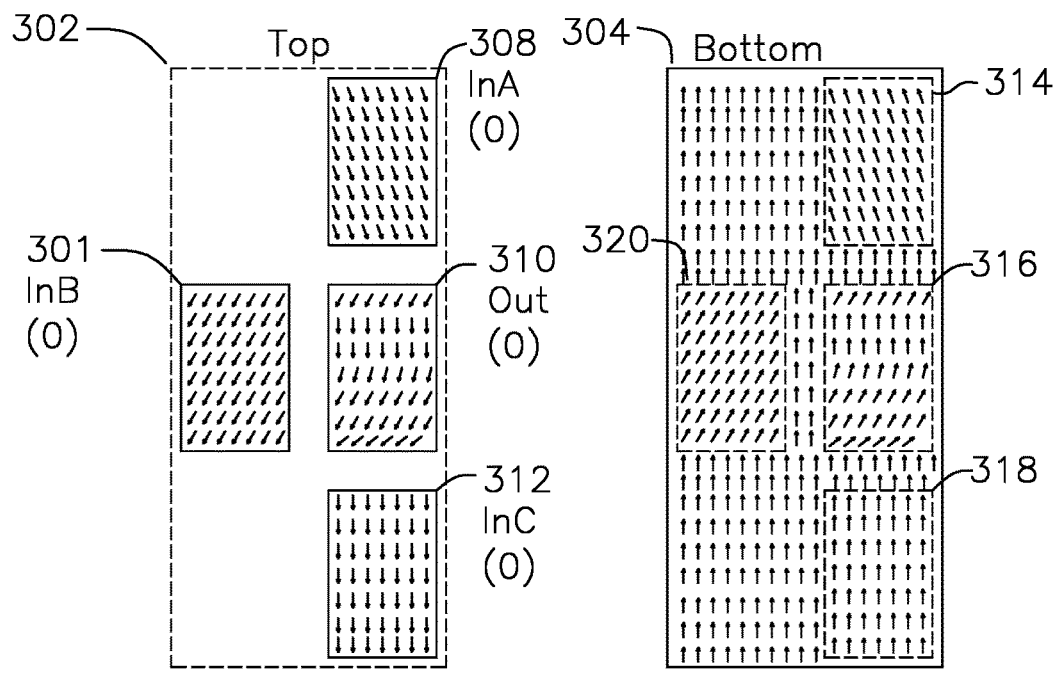

Section A–A

Section B–B

Section A–A

Section B–B

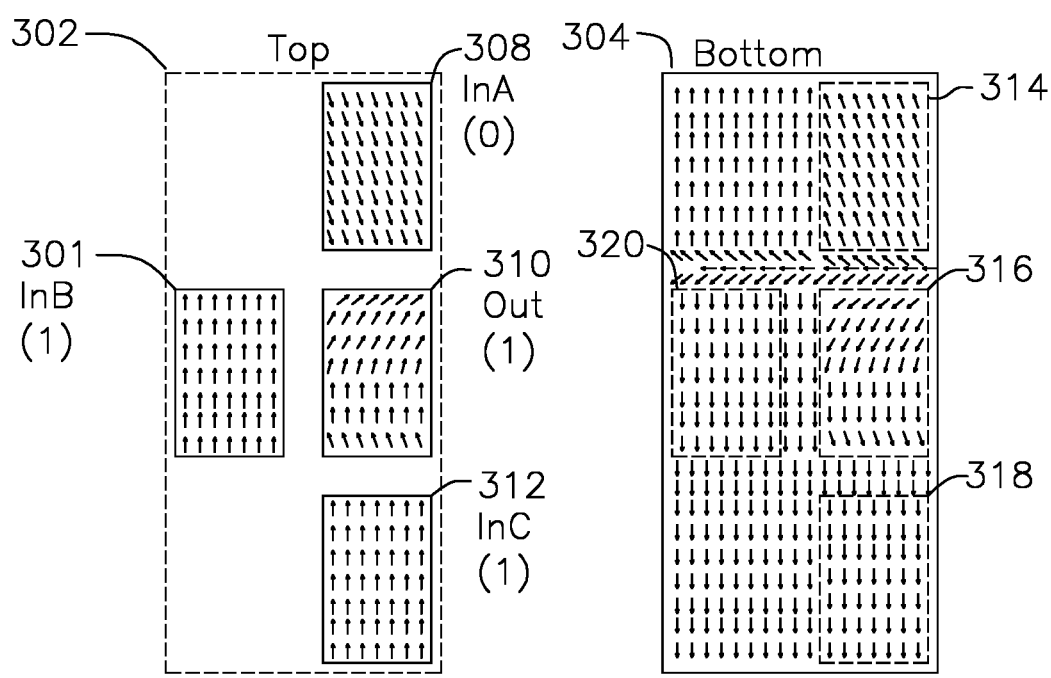

Figure 4A
Interlayer Exchange Coupling (IEC) with laternal coupling
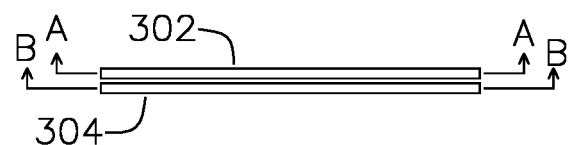
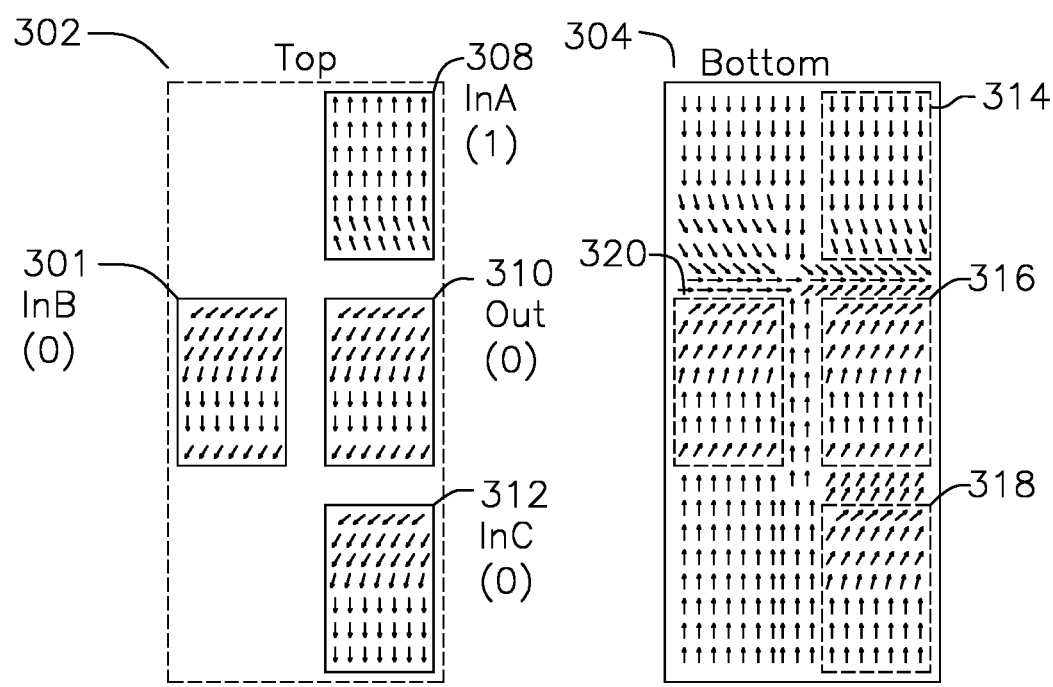
Figure 4B
Section A-A
Figure 4C
Section B-B Section A-A Section B-B

Figure 4F
Section A–A
Figure 4G
Section B–B
A(mode) B(in) C(in) Output
1 1 0 1
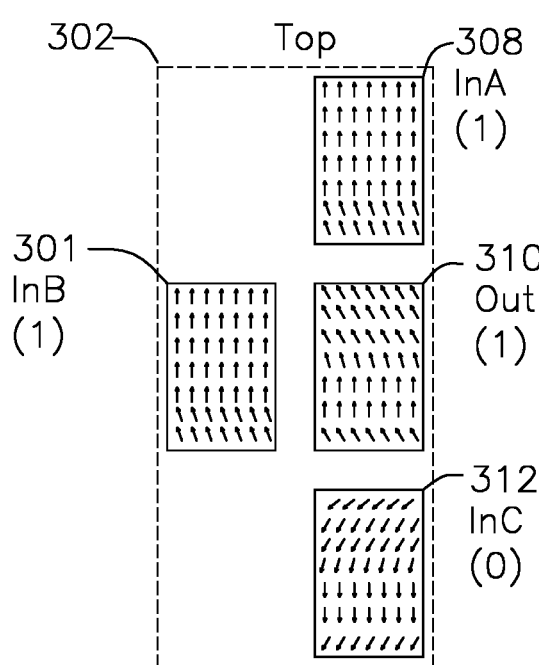
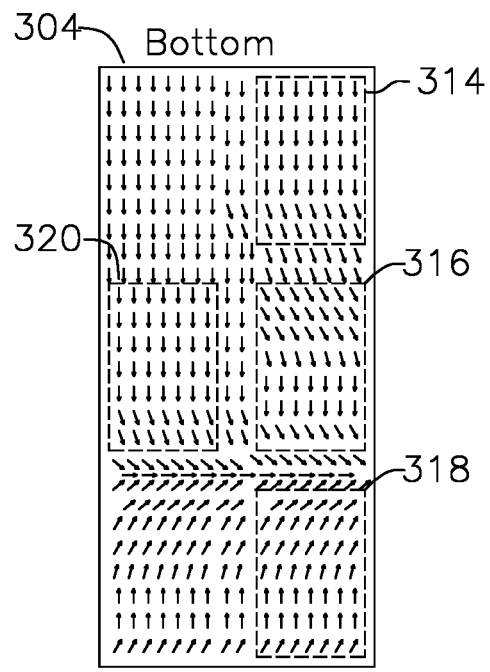

Section A-A

Section B-B

Interlayer Exchange Coupling (IEC) with laternal coupling

*Figure 5F*
A(mode) B(in) C(in) Output
0 0 1 1
Section B-B
Middle
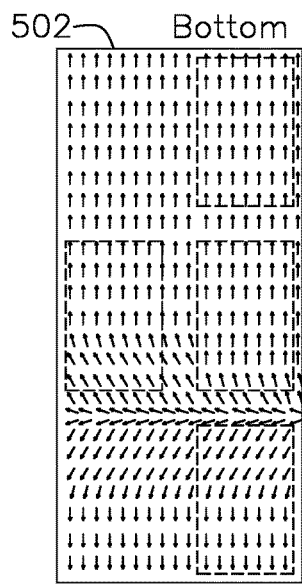
*Figure 5E*
Section C-C
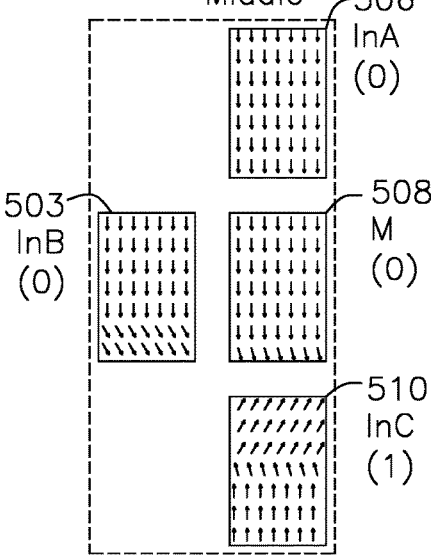
506 InA (0)
503 InB (0)
508 M (0)
510 InC (1)
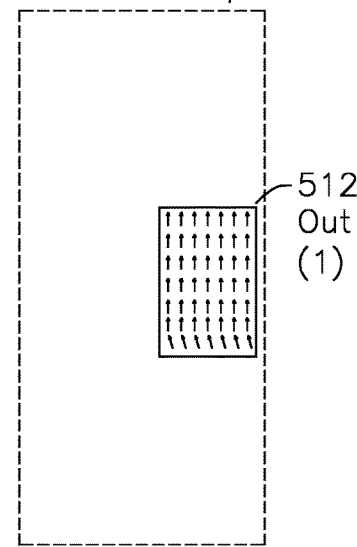
*Figure 5G*
Section A-A
Top
512 Out (1)
502 Bottom

*Figure 5I*
A(mode) B(in) C(in) Output
0 1 0 1
Section B-B
Middle
*Figure 5H*
Section C-C
*Figure 5J*
Section A-A
Top
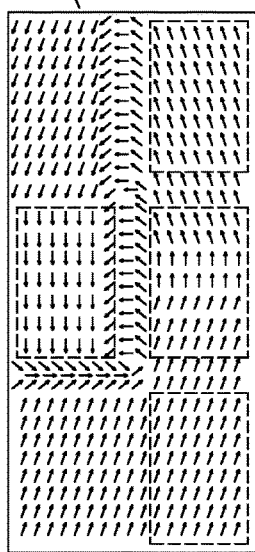
502 Bottom
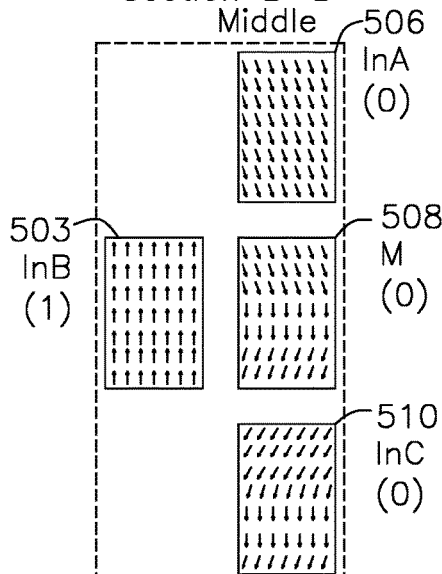
506 InA (0)
503 InB (1)
508 M (0)
510 InC (0)
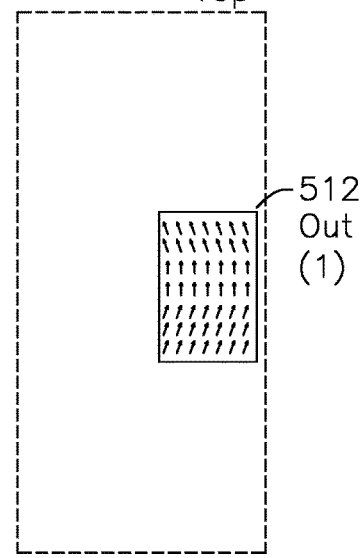
512 Out (1)

Section C-C

| A(mode) | B(in) | C(in) | Output |
|---------|-------|-------|--------|
| 0 | 1 | 1 | 0 |

Section B-B
Middle

Section A-A
Top

Interlayer Exchange Coupling (IEC) with lateral coupling

A(mode) B(in) C(in) Output
1　　　　 0　　 0　　 1

Section C-C

Section A-A Top

A(mode)  B(in)  C(in)  Output
1        0      1      0

Section B—B
Middle

- 606 InA (1)
- 603 InB (0)
- 608 M (1)
- 610 InC (1)

Section C—C

602 Bottom

Section A—A
Top

612 Out (0)

Section C-C
Top

| A(mode) | B(in) | C(in) | Output |
|---|---|---|---|
| 1 | 1 | 0 | 0 |

Section B-B
Middle

606 InA (1)
603 InB (1)
608 M (1)
610 InC (0)

Section A-A
Bottom

612 Out (0)

Section C-C

Section A-A
Top

INTERLAYER EXCHANGE COUPLING LOGIC CELLS

FIELD OF THE INVENTION

The present invention relates to logic cells. In particular, the invention relates to Interlayer Exchange Coupling (IEC) logic cells formed using ferromagnetic layers separated by a spacer layer of thickness sufficient to generate anti-ferromagnetic coupling of magnetic flux across the spacer layer.

BACKGROUND OF THE INVENTION

Various experimental configurations have been composed using the Giant MagnetoResistive (GMR) effect, where a first ferromagnetic layer is separated from a second ferromagnetic layer by a very thin non-magnetic material (typically on the order of several atomic thickness of a conductor such as copper). The GMR effect results in a magnetic field in the plane of one of the ferromagnetic layers generating an anti-ferromagnetic field in the other layer, the anti-ferromagnetic field being co-planar and of opposite sense.

Logic gates have been formed in the prior art using semiconductor technologies, which rely on semiconductor switching characteristics such as transconductance via field effect at an input to form a logic element. A table of common logic functions including: AND, NAND (not AND), OR, and NOR (not OR), as indicated below:

| Input A | Input B | AND Output | NAND output | OR OUTPUT | NOR Output |
|---|---|---|---|---|---|
| 0 | 0 | 0 | 1 | 0 | 1 |
| 0 | 1 | 0 | 1 | 1 | 0 |
| 1 | 0 | 0 | 1 | 1 | 0 |
| 1 | 1 | 1 | 0 | 1 | 0 |

A prior art fabrication for ferromagnetic logic utilizes dipole coupling of regions of ferromagnetic deposition onto a passive substrate. A dimensional limitation of nanoscale construction of these devices is that when the dipole coupled nanomagnets are scaled down to sub 50 nm, the reduction in associated energy barriers required to maintain magnetic state results in increased susceptibility towards soft errors whereby thermal noise causing perturbations of the ferromagnetic material can randomly flip the state of the nanomagnet and corrupt the information stored in it. Therefore, in order to successfully transfer information from one dot to the other the coupling energy between the nanomagnets should also exceed thermal noise. Although these devices work at low temperatures approaching 0° K, thermal noise interfering with the magnetic field orientation until the loss of magnetic properties associated with the material-specific Curie temperature is reached, and the device is no longer able to function. Additionally, when the dipole coupled nanomagnets are scaled down to sub 50 nm, the reduced size of the nanomagnets result in reduction of their energy barriers, which leads to increased susceptibility towards soft errors, where temperature fluctuations randomly flip the state of the nanomagnet and erase the stored information in it. Thus, in order to successfully transfer information from one dot to the other the coupling energy between the nanomagnets should be larger than thermal noise.

It is desired to provide an architecture and structures to perform logic operations such as OR, AND, NOR, and NAND gates using ferromagnetic films and which operate reliably at room temperatures (25° C.) and above.

OBJECTS OF THE INVENTION

A first object of the invention is a lateral coupled logic cell comprising a lower continuous layer of ferromagnetic material, a thin spacer layer sufficient to invoke a Giant MagnetoResistive (GMR) effect with anti-ferromagnetic response to an adjacent magnetic field, and an upper layer comprising a plurality of ferromagnetic regions, including an output ferromagnetic region adjacent to two input ferromagnetic regions also adjacent to each other, and a mode ferromagnetic input adjacent to one of the input ferromagnetic regions and also to the output ferromagnetic region, the two input ferromagnetic input regions operative as an AND gate when the mode ferromagnetic input has a magnetic field in one direction and the two input ferromagnetic input regions operative as an OR gate when the mode ferromagnetic input has a magnetic field in an opposing direction.

A second object of the invention is a logic device comprising a continuous bottom layer of ferromagnetic material separated from a plurality of regions of ferromagnetic material on a middle layer, the plurality of regions including a mezzanine region having a mode input ferromagnetic region adjacent to one edge of the mezzanine region and two login input ferromagnetic regions adjacent to each other and also adjacent to two edges of the mezzanine region, the mezzanine region coupled through a thin layer of non-ferromagnetic and electrically conductive material to an output comprised of a region of ferromagnetic material positioned on a layer above the mezzanine layer.

SUMMARY OF THE INVENTION

An Interlayer Exchange Coupling (IEC) logic cell in a first example of the invention comprises two layers of ferromagnetic material such as an upper ferromagnetic layer and a lower ferromagnetic layer separated by an extremely thin non-magnetic electrically conductive layer which generates the GMR effect and associated anti-ferromagnetic response on the adjacent layer. One of the ferromagnetic layers has a plurality of logic inputs formed as ferromagnetic regions on the upper layer and adjacent to a mode input also formed as a ferromagnetic region on the same layer, the logic inputs adjacent to each other and also adjacent to the mode input and also an output formed as a ferromagnetic region on the same layer. The logic input ferromagnetic region, mode input ferromagnetic region, and output ferromagnetic region are co-planar on the single upper first layer and separated from the lower second layer formed as a continuous ferromagnetic layer, the separator being a thin non-magnetic layer such as copper or other conductor which is a just few atomic thickness of Copper, or alternatively of a thickness sufficient to invoke an anti-ferromagnetic effect, where a magnetic polarity applied to the mode input or logic inputs results in magnetic polarity of substantially equal magnitude but opposite direction or sense on the adjacent layer, and the continuous ferromagnetic lower layer generates a superposition of the applied ferromagnetic field vectors. The lower layer may be continuous, or it may comprise regions of ferromagnetic material which couple a magnetic field from one region to another region, as shown in the figures which follow. The magnetic polarities applied to the logic inputs or mode input may be generated using any method, including a loop of wire, sheet conductors, or other electromagnetic source which provides a directed magnetic field.

In a second example of the invention a logic device is formed on three layers of ferromagnetic material, each ferromagnetic layer separated from an adjacent layer by a thin non-magnetic layer of material which is just a few angstroms thick, sufficiently thin to induce an anti-ferromagnetic response from the ferromagnetic adjacent layer. A bottom layer of the logic device is a continuous layer of ferromagnetic material, separated from the middle ferromagnetic layer by one of the thin non-magnetic layers. The middle ferromagnetic layer has a mezzanine ferromagnetic region surrounded by two adjacent input ferromagnetic regions and a mode ferromagnetic region. A third layer has an output ferromagnetic region coupled to, and separated from the mezzanine ferromagnetic region, by the second thin insulating layer. This second example of the device operates as a NAND gate when the mode input is on one magnetization state and as a NOR gate when the mode input is in the opposite magnetization state.

BRIEF DESCRIPTION OF THE DRAWINGS

FIG. 3 is an exploded perspective view of a two layer logic device.

FIGS. 3A, 3B, and 3C are cross section and planar section views of an AND gate for applied magnetizations.

FIGS. 3H and 3I are planar section views of FIG. 3A showing an AND gate for applied magnetizations.

FIGS. 4A, 4B, and 4C are cross section and planar section views of an OR gate for applied magnetizations.

FIGS. 4F and 4G are cross section and planar section views of FIG. 4A showing an OR gate for applied magnetizations.

FIGS. 5E, 5F, and 5G are planar section views of FIG. 5A showing a NAND gate for applied magnetizations.

FIGS. 5H, 5I, and 5J are planar section views of FIG. 5A showing a NAND gate for applied magnetizations.

DETAILED DESCRIPTION OF THE INVENTION

As described in the background, it is desired to provide a nanomagnetic logic device which operates at higher temperatures than the prior art. The Interlayer Exchange Coupled (IEC) scheme of the present invention has been shown to offer stronger interaction between thin nanomagnets, resulting in greater scalability and better data retention at the deep sub-micron level, hence allowing magnetic interaction to be manipulated both in the vertical and lateral directions at the same time.

Figure 1A:
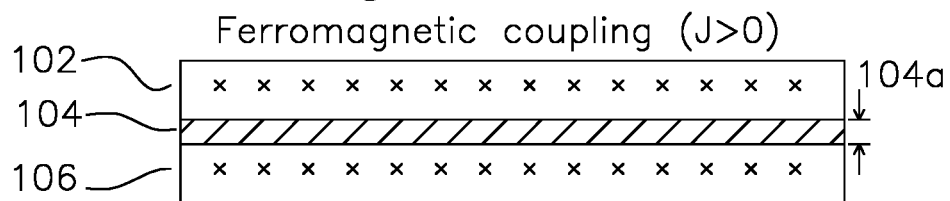
FIG. 1A is a cross section of ferromagnetic material layers separated by a non-magnetic layer of thickness sufficient to invoke a ferromagnetic response.
Figure 1B:
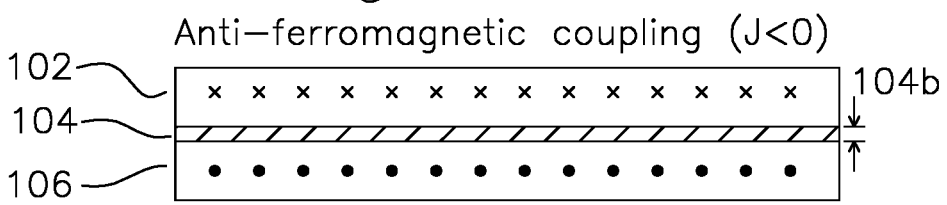
FIG. 1B is a cross section as in FIG. 1A with a thin non-magnetic layer of thickness sufficient to invoke an anti-ferromagnetic response.
Figure 2A:
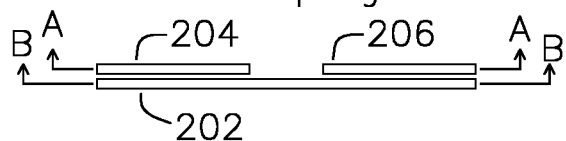
FIG. 2A is a cross section view of a two layer IEC with co-planar sections shown in FIGS. 2B and 2C.
Figure 2B:
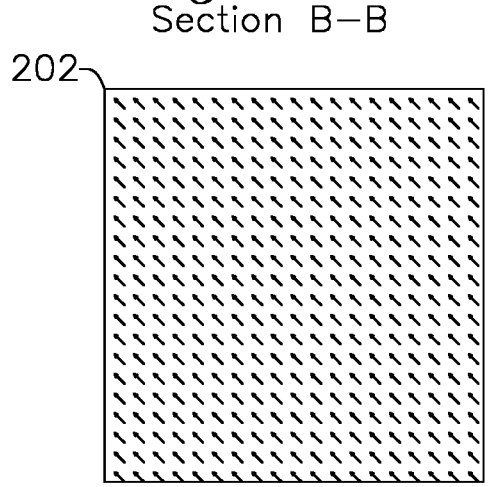
Figure 2C:
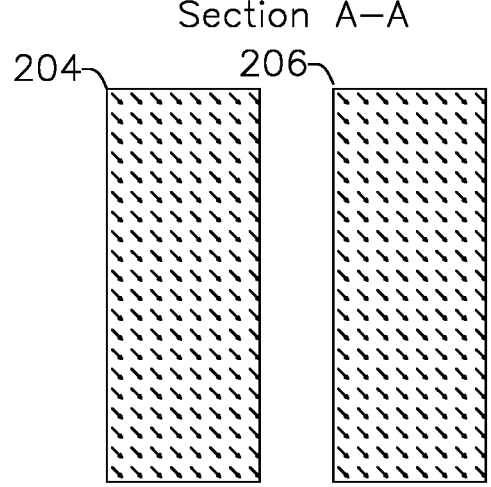

FIG. 1A shows a first ferromagnetic layer 102 separated from a second ferromagnetic layer 106 by a non-magnetic electrically conductive layer 104 such as copper. Where the non-magnetic layer 104 is too thick 104a to invoke the Giant MagnetoRestrictive (GMR) effect, the two ferromagnetic layers 102 and 106 couple magnetic field in the same direction, resulting in ferromagnetic coupling shown in FIG. 1A, where the X symbols represent the tail of a magnetic field vector perpendicular to the plane of the figure. When the thickness of the conductive layer 104 is reduced to just a few hundred angstroms thick, or a deposition of thickness on the order of a few atomic thickness, the two layers demonstrate anti-ferromagnetic coupling, where the magnetic fields are of opposite sense, as shown in FIG. 1B with atomic conductor 104 thickness 104b. FIGS. 2A, 2B, and 2C show the anti-ferromagnetic effect for an example device with lower layer 202 and first upper layer 204 and second co-planar upper layer 204. There the two ferromagnetic regions 204 and 206 of FIG. 2B have a planar magnetic vector pointing to the lower right, the bottom ferromagnetic plane 202 will generate an anti-ferromagnetic planar magnetization of the opposite polarity to the upper right as shown in FIG. 2B.

The ferromagnetic regions may be formed from an alloy such as 80% Nickel (Ni) and 20% Iron (Fe), and the conductive non-ferromagnetic layer 104 may be formed of Ruthenium (Ru), Copper (Cu), or other electrically conductive material. The ferromagnetic regions may be formed in a thickness on the order of 5 nm, and of dimensions on the order of 100 nm×100 nm. In one example of the invention, the conductive non-ferromagnetic layer may be in the range 1 nm to 10 nm thickness, or on the order of magnitude of 1 nm to 10 nm thickness.

FIG. 3 shows an exploded perspective view of an example logic device in a first example of the invention. Bottom layer 304 is a continuous ferromagnetic layer separated by discrete ferromagnetic regions 308 (Input A), 310 (Output), 312 (Input C), and 301 (Input B) formed on ferromagnetic upper layer 302. In the present series of figures, it is understood that the particular convention of logic "1" and "0" is arbitrary so long as uniformly applied, but for clarity in understanding the present examples, a "1" will represent a magnetic field pointing generally upwards (or a majority of the field direction is upwards) and in the plane of the drawings, and a "0" will represent a magnetic field point downwards (or a majority of the field direction is downwards) and in the plane of the drawings. Other conventions are possible, this convention is used only for clarity in understanding the invention.

The devices operate with two logic inputs and a mode input, which selects the type of logic function performed. The mode input and logic input have identical response times, and since the magnetization is stored in the ferromagnetic layer until it is changed, the device does not dissipate any power when the magnetic field is not being changed. In general, the magnetic field polarization of the logic inputs and mode input in the upper layer establish anti-ferromagnetic responses in the lower layer. The input ferromagnetic layers and mode ferromagnetic layers generate an anti-ferromagnetic response in the lower ferromagnetic layer, and these anti-ferromagnetic responses generate a superposition of magnetic fields in a region of the lower layer which is separated from and anti-ferromagneticly coupled to an upper layer output ferromagnetic region.

Figure 3D:
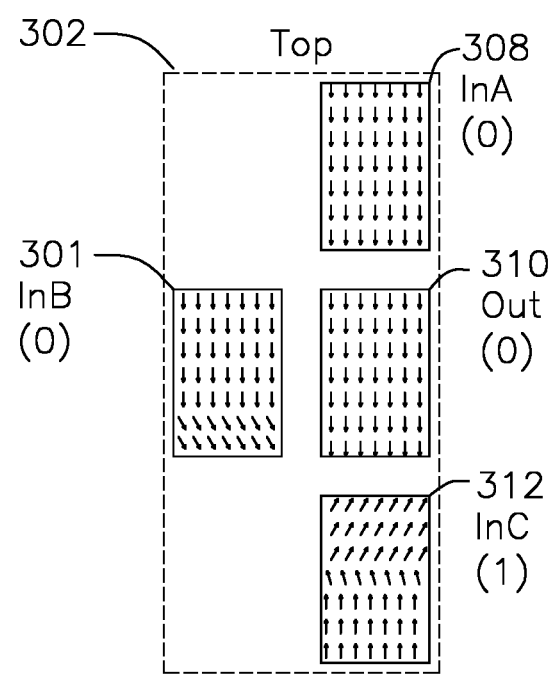
FIGS. 3D and 3E are planar section views of FIG. 3A showing an AND gate configuration for applied magnetizations.
Figure 3E:
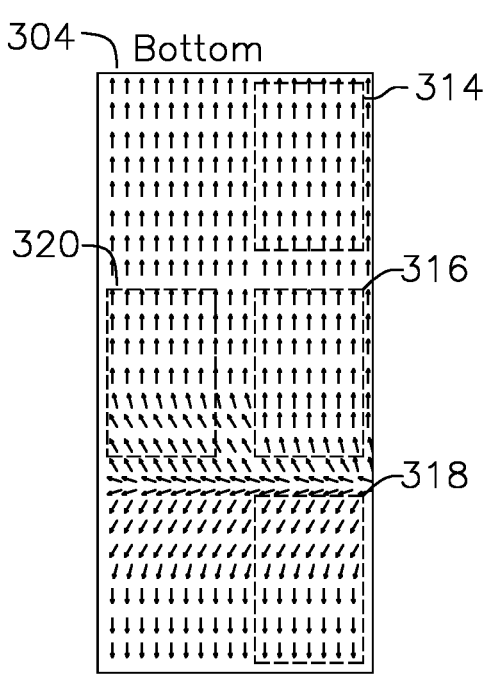
Figures 3F, 3G:
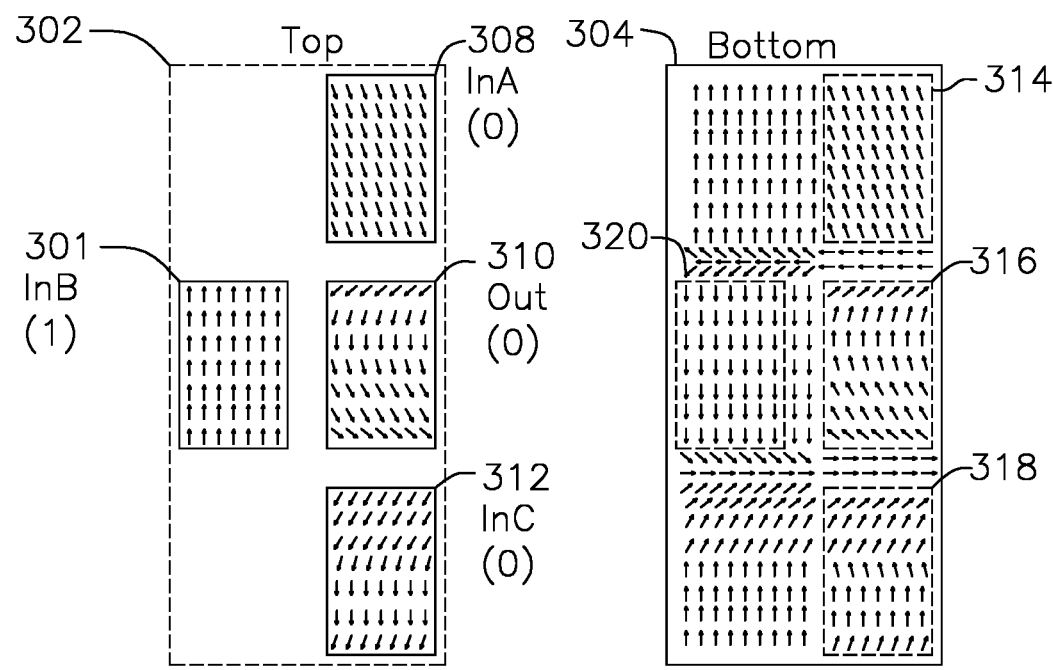
FIGS. 3F and 3G are planar section views of FIG. 3A showing an AND gate for applied magnetizations.
Figures 4D, 4E:
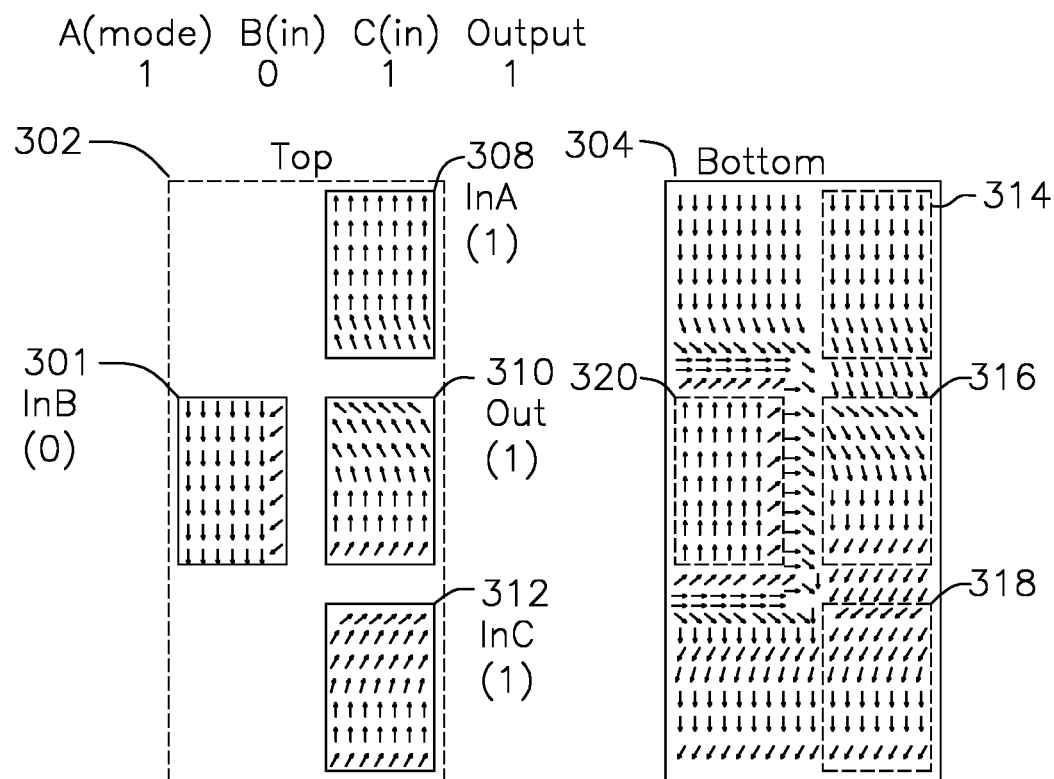
FIGS. 4D and 4E are planar section views of FIG. 4A showing an OR gate for applied magnetizations.
Figures 4H, 4I:
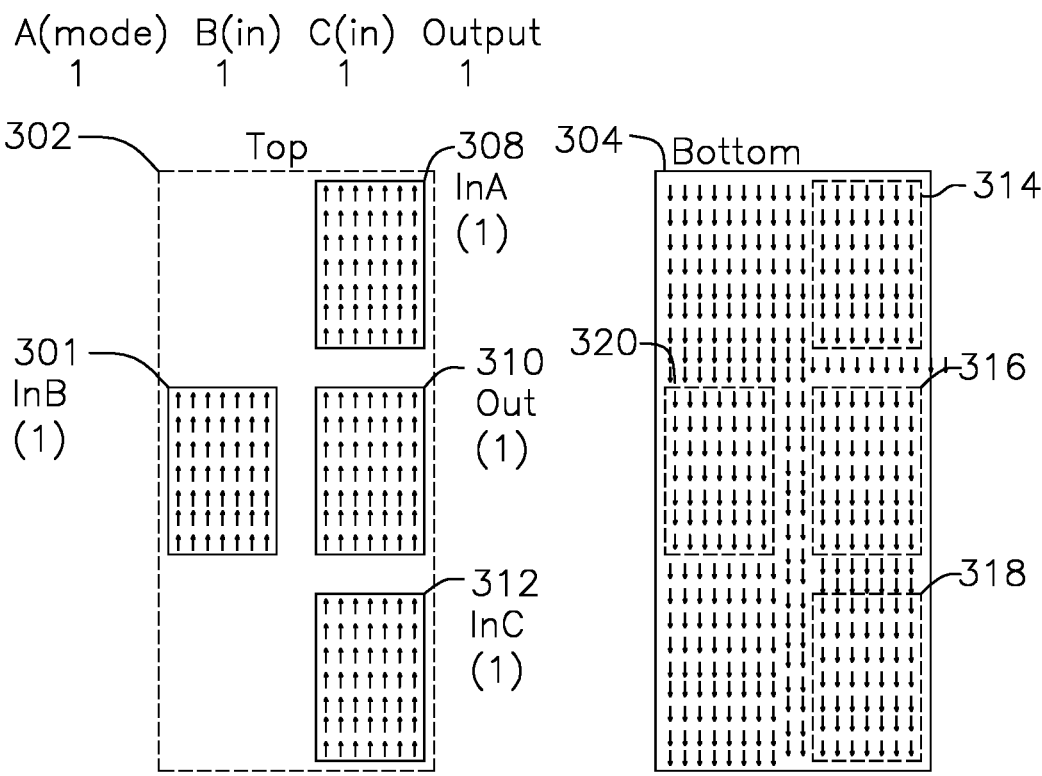
FIGS. 4H and 4I are cross section and planar section views of FIG. 4A showing an OR gate for applied magnetizations.

FIG. 3A (with 3B and 3C, 3D and 3E, 3F and 3G, 3H and 3I) show an IEC in cross section for an AND gate function (mode input A=0), and with various logic input B and logic input C expressed as magnetic fields. For the AND case (mode input A=0) shown in FIGS. 3B and 3C where inputs B=0 and C=0, the anti-ferromagnetic field coupled into regions 314, 320, 318 generate a superposition magnetic field orientation in region 316 on the same lower layer, which generates opposite polarity field to produce output value 0 on output region 310. FIGS. 3D and 3E, 3F and 3G, 3H and 3I illustrate the AND mode function for inputs [B,C]=[0,1], [1,0], and [1,1] respectively. The top layer is shown in dashed outline 302, but comprises the discrete bounded ferromagnetic areas 308, 301, 312, and 310 which are formed above the thin conductive layer between planes 302 and 304.

FIGS. 4A, 4B and 4C, 4D and 4E, 4F and 4G, 4H and 4I show an IEC in cross section for an OR gate function (mode input A=1), and with various logic input B and logic input C expressed as magnetic fields. For the OR case (mode input A=1) shown in FIG. 4B where inputs B=0 and C=0, the anti-ferromagnetic field coupled into regions 314, 320, 318 generate a superposition magnetic field orientation in region 316 on the same lower layer, which generates opposite polarity field to produce output value 0 on output region 310. FIGS. 4D and 4E, 4F and 4G, 4H and 4I illustrate the OR mode function for inputs [B,C]=[0,1], [1,0], and [1,1] respectively.

Figure 5:
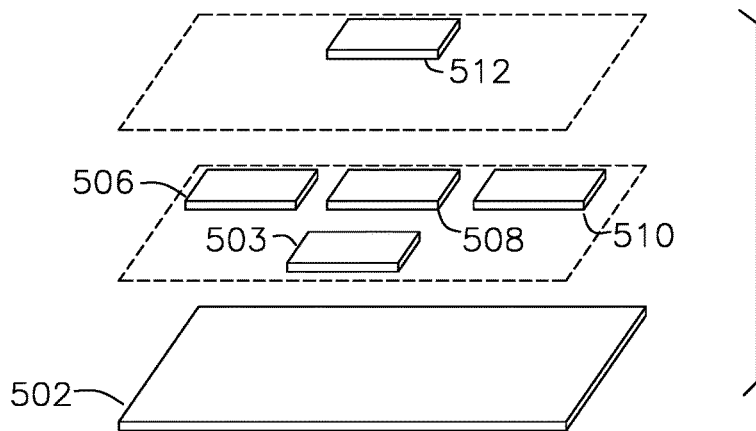
FIG. 5 is an exploded perspective view of a three layer logic device.

FIG. 5 shows an exploded view of a second example of the invention where continuous bottom ferromagnetic layer 502 (shown in planar section C-C in FIGS. 5A, 5B, 5E, 5H, 5K, 6A, 6B, 6E, 6H, and 6K) is separated from middle layer ferromagnetic regions 503, 506, 508, 510 by a thin electrically conductive non-ferromagnetic material as previously described to generate the anti-ferromagnetic response on the adjacent layer. The device output is taken from a top layer of ferromagnetic material 512 positioned above mezzanine layer 508, and separated a second thin non-ferromagnetic conductive layer sufficient to generate an anti-ferromagnetic response with mezzanine layer 508 to form the device output. The solid outlines 503, 506, 508, 510 indicate the ferromagnetic regions applied with a dashed outline to indicate orientation with respect to lower layer 502.

Figure 5A:
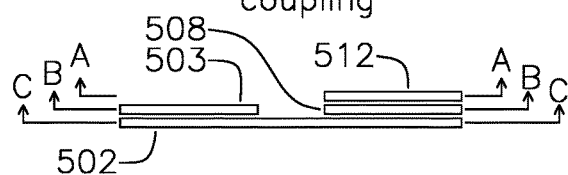
FIGS. 5A, 5B, 5C, and 5D are cross section and planar section views of a NAND gate for applied magnetizations.
Figure 5C:
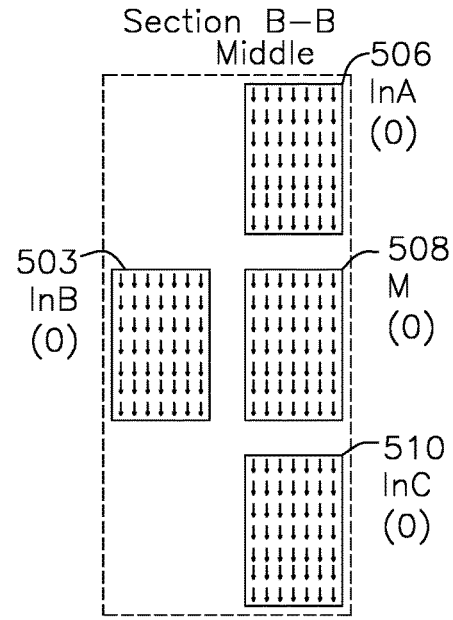
Figure 5B:
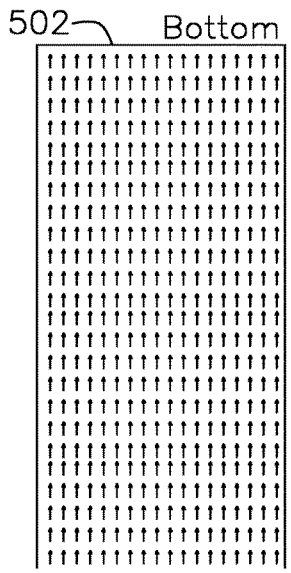
Figure 5D:
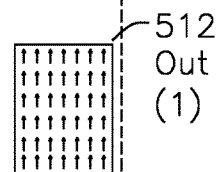
Figure 5K:
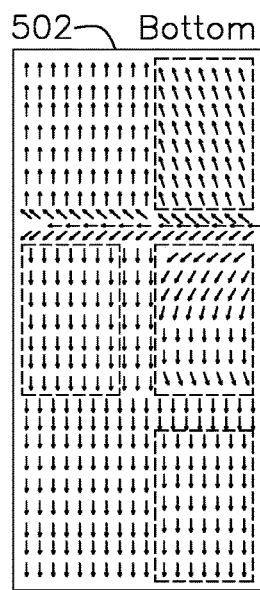
FIGS. 5K, 5L, and 5M are planar section views of FIG. 5A showing a NAND gate for applied magnetizations.
Figure 5L:
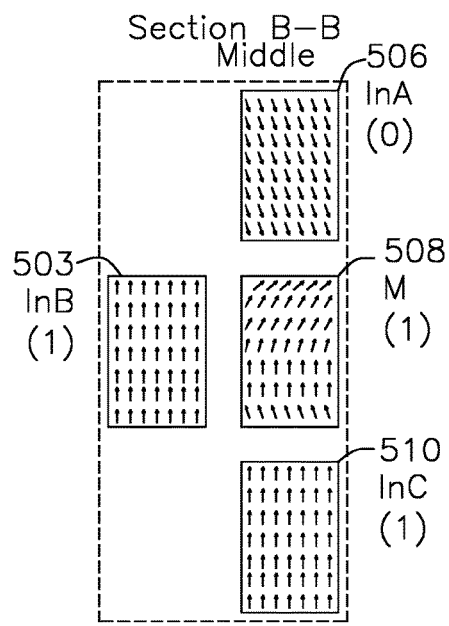
Figure 5M:
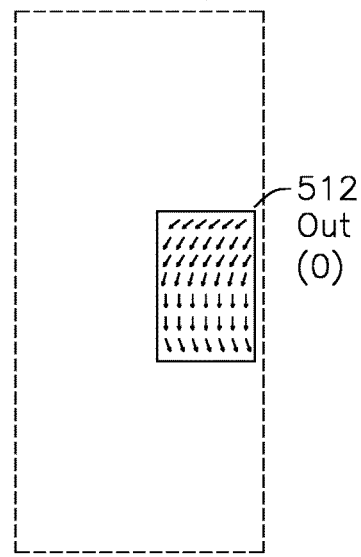

FIG. 5A (with FIGS. 5B, 5C, and 5D; 5E, 5F and 5G; 5H, 5I, and 5J; 5K, 5L, and 5M) show an IEC in cross section for a NAND gate function (mode input A=0), and with various logic input B and logic input C also expressed as magnetic fields. For the NAND case (mode input A=0) shown in FIGS. 5B, 5C, and 5D where inputs B=0 and C=0, the anti-ferromagnetic field coupled into regions 506, 503, 510 generate a superposition magnetic field orientation in the lower layer 502 region below region 508 of the middle layer, which generates opposite polarity field at the M ferromagnetic region 508 with value 0 which is inverted to 1 on output region 512. FIGS. 5E, 5F, 5G; 5H, 5I, 5J; and 5K, 5L and 5M illustrate the NAND mode function for inputs [B,C]=[0,1], [1,0], and [1,1] respectively.

Figure 6A:
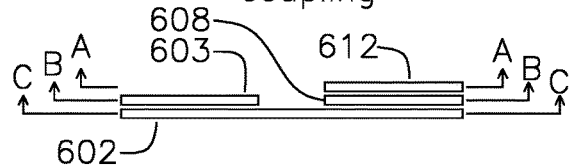
FIGS. 6A, 6B, 6C, and 6D are cross section and planar section views of FIG. 6A showing a NOR gate for applied magnetizations.
Figure 6C:
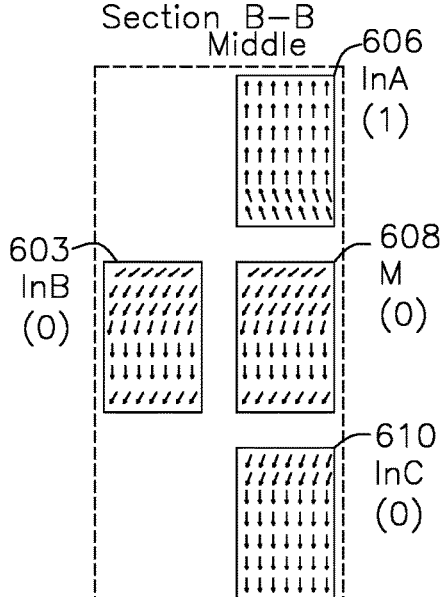
Figure 6B:
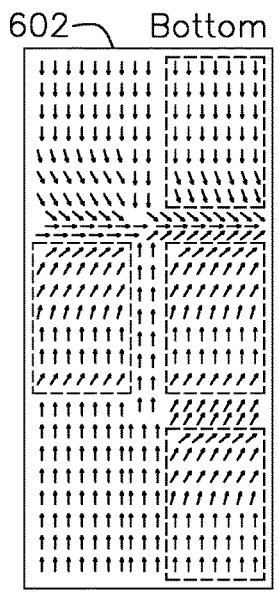
Figure 6D:
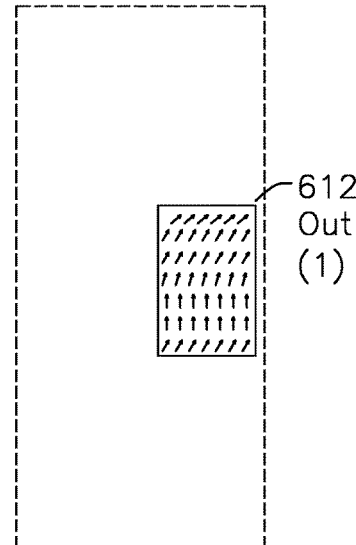
Figure 6F:
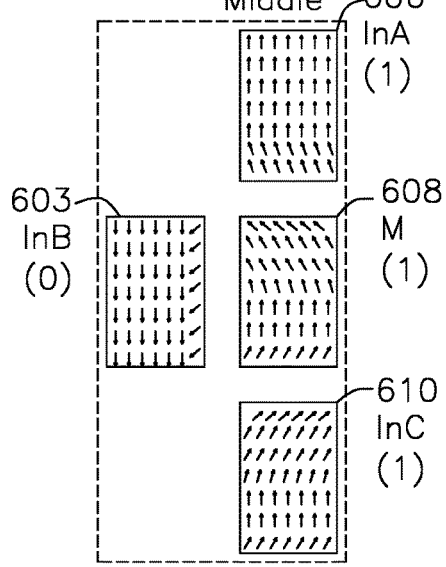
FIGS. 6E, 6F, and 6G are planar section views of FIG. 6A showing a NOR gate for applied magnetizations.
Figure 6E:
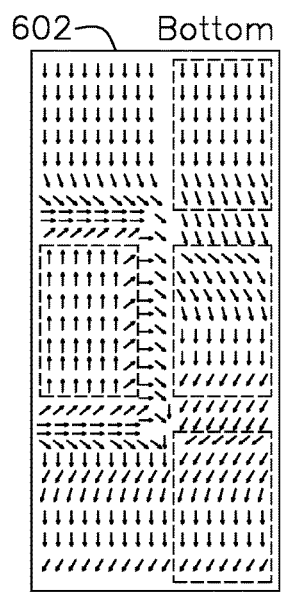
Figure 6G:
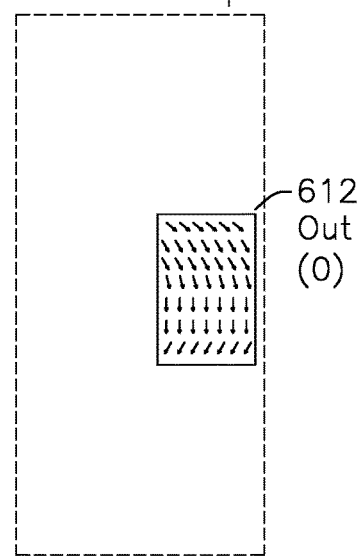
Figure 6H:
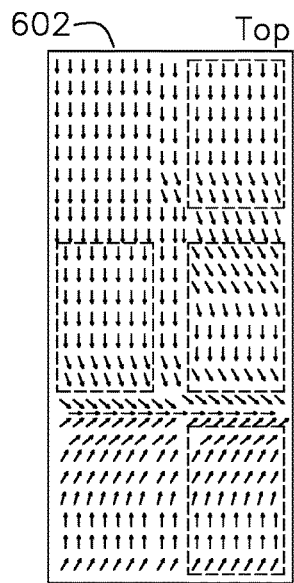
FIGS. 6H, 6I, and 6J are planar section views of FIG. 6A showing a NOR gate for applied magnetizations.
Figure 6I:
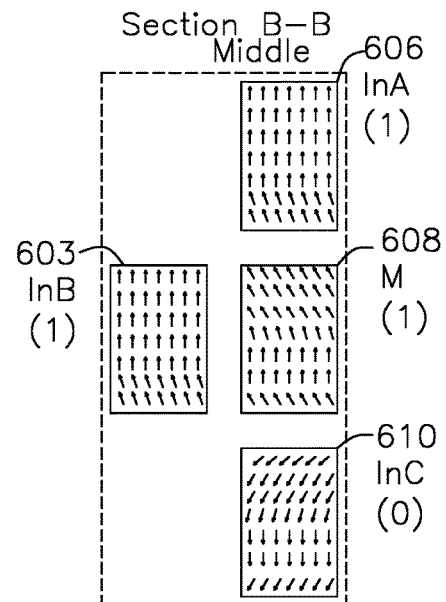
Figure 6J:
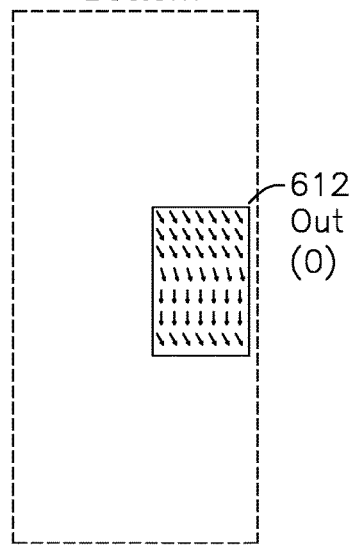
Figure 6K:
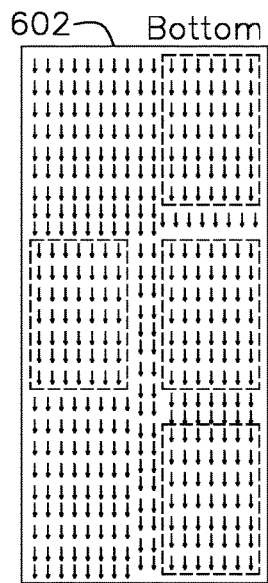
FIGS. 6K, 6L, and 6M are planar section views of FIG. 6A showing a NOR gate for applied magnetizations.
Figure 6L:
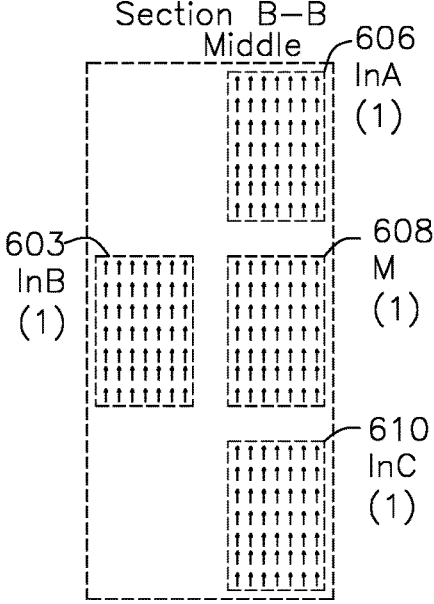
Figure 6M:
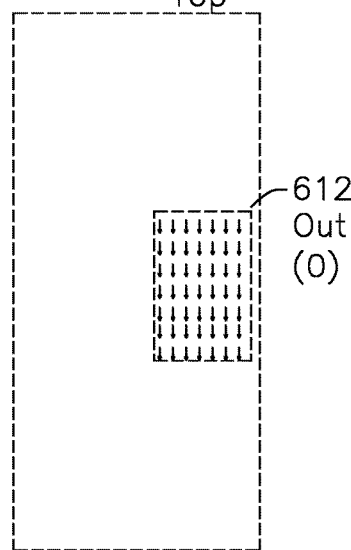

FIG. 6A (with 6B, 6C, 6D; 6E, 6F, 6G; 6H, 6I, 6J; and 6K, 6L, and 6M) show an IEC in cross section for a NOR gate function (mode input A=1), and with various logic input B and logic input C also expressed as magnetic fields. For the NOR case (mode input A=1) shown in FIGS. 6B, 6C, and 6D where inputs B=0 and C=0, the anti-ferromagnetic field coupled into regions 606, 603, 610 generate a superposition magnetic field orientation in the lower layer 602 region below region 608 of the middle layer, which generates opposite polarity field at the M ferromagnetic region 608 with value 0 which is inverted to 1 on output region 612. FIGS. 6E, 6F, 6G; 6H, 6I, 6J; and 6K, 6L, and 6M illustrate the NOR mode function for inputs [B,C]=[0,1], [1,0], and [1,1] respectively.

In one example of the invention, the mode input 308 of the AND gate of FIGS. 3B, 3D, 3F, and 3H, and OR gate of FIGS. 4B, 4D, 4F, and 4H determines whether the mode of operation as a static or persistent value compared to the logic inputs 301 and 312 which may be comparatively transient or dynamic. In another example of the invention, the mode input 506 of FIGS. 5C, 5F, 5I, 5L, and mode input 606 of FIGS. 6C, 6F, 6I and 6L statically determines whether the device operates as a NOR gate of FIG. 5A or NAND gate of FIG. 6A, while the logic inputs 503 and 510 of FIGS. 5C, 5F, 5I and 5L, and logic inputs 603 and 610 of FIGS. 6C, 6F, 6I and 6L are comparatively transient or dynamic in particular logic level.

The present examples are provided for illustrative purposes only, and are not intended to limit the invention to only the embodiments shown.

The invention claimed is:
1. A logic device comprising:
   a continuous bottom layer of ferromagnetic material;
   a first layer of non-ferromagnetic electrically conductive material applied to a surface of the continuous bottom layer of ferromagnetic material;
   a plurality of regions of ferromagnetic material applied to the layer of non-ferromagnetic electrically conductive material comprising:
      a mezzanine region of ferromagnetic material;
      a plurality of logic inputs formed from ferromagnetic material and positioned adjacent to the mezzanine region;
      a mode input formed from ferromagnetic material and positioned adjacent to one of the logic inputs and also adjacent to the mezzanine region;
   a second layer of non-ferromagnetic electrically conductive material applied to a surface of the mezzanine region of ferromagnetic material;
   an output layer of ferromagnetic material applied to the second layer of non-ferromagnetic electrically conductive material.

2. The logic device of claim 1 where the logic device is a NAND logic function when the mode input is 0.

3. The logic device of claim 1 where the logic device is a NOR logic function when the mode input is 1.

4. The logic device of claim 1 where the ferromagnetic material is an alloy of Iron (Fe) and Nickel (Ni).

5. The logic device of claim 1 where the ferromagnetic material has a thickness on the order of 1 nm, or on the order of 10 nm.

6. The logic device of claim 1 where the non-ferromagnetic electrically conductive material is Ruthenium or Copper.

7. The logic device of claim 1 where the non-ferromagnetic electrically conductive material has a thickness on the order of 5nm.

8. The logic device of claim 1 where at least one of a logic input ferromagnetic region, a mode input ferromagnetic region, or the output layer has a rectangular shape.

9. The logic device of claim 1 where the mode input is a static logic value when the at least one logic input has a comparatively dynamic logic value.

10. A logic device comprising:
  a bottom layer of ferromagnetic material operable to couple a magnetic field from one region into other region of the bottom layer;
  a first layer of non-ferromagnetic electrically conductive material applied to a surface of the bottom layer of ferromagnetic material;
  a plurality of regions of ferromagnetic material applied to the layer of non-ferromagnetic electrically conductive material comprising:
    a mezzanine region of ferromagnetic material;
    a plurality of logic inputs formed from ferromagnetic material and positioned adjacent to the mezzanine region;
    a mode input formed from ferromagnetic material and positioned adjacent to one of the logic inputs and also adjacent to the mezzanine region;
  a second layer of non-ferromagnetic electrically conductive material applied to a surface of the mezzanine region of ferromagnetic material;
  an output layer of ferromagnetic material applied to the second layer of non-ferromagnetic electrically conductive material.

11. The logic device of claim 10 where the logic device is a NAND logic function when the mode input is 0.

12. The logic device of claim 10 where the logic device is a NOR logic function when the mode input is 1.

13. The logic device of claim 10 where the ferromagnetic material is an alloy of Iron (Fe) and Nickel (Ni).

14. The logic device of claim 10 where the ferromagnetic material has a thickness on the order of 1 nm, or on the order of 10 nm.

15. The logic device of claim 10 where the non-ferromagnetic electrically conductive material is Ruthenium or Copper.

16. The logic device of claim 10 where the non-ferromagnetic electrically conductive material has a thickness on the order of 5nm.

17. The logic device of claim 10 where at least one of a logic input ferromagnetic region, a mode input ferromagnetic region, or the output layer has a rectangular shape.

18. The logic device of claim 10 where the mode input is a static logic value when the plurality of logic inputs are comparatively dynamic logic values.

\* \* \* \* \*